United States Patent [19]
Vane
[11] 3,735,286
[45] May 22, 1973

[54] VARACTOR TUNED COAXIAL CAVITY NEGATIVE RESISTANCE DIODE OSCILLATOR

[75] Inventor: Arthur B. Vane, Menlo Park, Calif.
[73] Assignee: Varian Associates, Palo Alto, Calif.
[22] Filed: May 1, 1972
[21] Appl. No.: 249,063

[52] U.S. Cl.............331/101, 331/107 R, 331/107 G, 331/177 V
[51] Int. Cl...............................................H03b 7/14
[58] Field of Search.....................331/96, 101, 107 R, 331/107 G, 177 V

[56] References Cited

UNITED STATES PATENTS

| | | | |
|---|---|---|---|
| 3,474,351 | 10/1969 | Cook et al. | 331/107 R |
| 3,599,118 | 8/1971 | Large | 331/177 V X |
| 3,638,143 | 1/1972 | Higashi | 331/101 X |

*Primary Examiner*—Roy Lake
*Assistant Examiner*—Siegfried H. Grimm
*Attorney*—Stanley Z. Cole, Chester E. Martine, Jr., and Harry E. Aine

[57] ABSTRACT

A Gunn diode is connected in series with the center conductor of coaxial resonator for exciting the resonator with microwave energy. A first voltage variable capacitor is disposed within the resonator in series with the Gunn diode for tuning thereof. The voltage variable capacitor is carried at the inner end of a choke structure disposed within the hollow interior of a conductive sleeve in DC insulated relation to the sleeve. An inductive wire is parallel resonated with the package capacitance of the series voltage variable capacitor and connects the inner terminal of the voltage variable capacitor to the sleeve of the choke for applying a variable bias voltage to the voltage variable capacitor for tuning the resonator. A similar second voltage variable capacitor and choked sleeve support is connectable for shunt tuning of the Gunn diode.

8 Claims, 2 Drawing Figures

VARACTOR TUNED COAXIAL CAVITY NEGATIVE RESISTANCE DIODE OSCILLATOR

DESCRIPTION OF THE PRIOR ART

Heretofore microwave oscillator circuits have been proposed wherein both a Gunn diode and a voltage variable capacitor were connected in series with the center conductor of a coaxial resonator. The common terminal between the voltage variable capacitor and the Gunn diode was operated at DC ground and independent bias voltages were applied to opposite ends of the series connection of voltage variable capacitor and Gunn diode for separately biasing the diode of the Gunn oscillator and voltage variable capacitor. The resonator was electronically tunable over a relatively wide band via the voltage variable capacitor. A device of this character is disclosed in U.S. Pat. No. 3,638,143 issued Jan. 25, 1972.

The problem with the series connection of the voltage variable capacitor and the Gunn diode is that DC ground potential has to be applied to the common terminal intermediate the series connection of the voltage variable capacitor and the Gunn diode. This has been accomplished, in the prior art, by bringing a transverse conductive post or lead through or from a side wall of the coaxial resonator to a point on the center conductor intermediate the series connection of the variable capacitive diode and the Gunn diode. Such a transverse post or conductor introduces unwanted interfering modes of resonance. The result is that the power output versus frequency characteristic of the solid state oscillator is discontinuous at points of interfering modes of resonance occurring within the tunable band of the oscillator.

Another problem with the series connection of Gunn diode and voltage variable capacitor (varactor) is that such elements, due to their series connection in the center conductor of the coaxial resonator, do not lend themselves to mechanical adjustments during manufacture such that it is difficult to compensate for variations in the parameters of the varactor diodes encountered in production.

It is also known to tune a resonator containing a Gunn diode by inserting a voltage variable capacitor into the resonator in shunt with the Gunn diode. Such a circuit is disclosed in U.S. Pat. No. 3,465,265 issued Sept. 2, 1969. One known way of inserting a voltage variable tuning capacitor into a resonator is to bond one terminal of the voltage variable capacitor to a DC insulated coaxial radio frequency choke structure contained within a conductive tube. An inductive wire, having resonances outside of the tunable range of the resonator, interconnects with the other terminal of the voltage variable capacitor and the tube. The tuning bias voltage for the varactor diode is applied between the choked center conductor and the outer tube for tuning the cavity.

SUMMARY OF THE PRESENT INVENTION

The principal object of the present invention is the provision of an improved electronically tunable solid state oscillator.

In one feature of the present invention, the DC ground potential for the center tap of a series connection of a solid state oscillating element and a voltage variable capacitor, in the gap of a coaxial cavity, is brought in by an inductive wire interconnecting the center tap and the inner conductor of the coaxial cavity, such wire being parallel resonated with the package capacitance of the capacitor within the tunable band of the oscillating element. A separate DC bias potential, either for the oscillating element or tuning capacitor, is brought in through a coaxial choke structure within the inner conductor of the coaxial resonator, whereby undesired interfering modes of oscillation within the tunable band of the oscillator are avoided.

In another feature of the present invention, a solid state oscillating element is connected in series with the center conductor of a coaxial resonator and a voltage variable capacitor tuning element is inserted within the resonator in shunt with the solid state oscillating element. The voltage variable capacitor is mounted on the end of a radio frequency choke structure disposed within a hollow tube in DC insulative relation thereto with the inner terminal of the voltage variable capacitor being connected to the hollow tube by means of an inductive wire having a mode of resonance outside of the tunable band of the oscillator, whereby independent adjustment of the insertion of the voltage variable capacitor into the coaxial resonator is obtained to compensate for variations in the parameters of the voltage variable capacitors in manufacture without disturbing the configuration of the connection of the solid state oscillating element.

Other features and advantages of the present invention become apparent upon a perusal of the following specification taken in connection with the accompanying drawings wherein:

DESCRIPTION OF THE PREFERRED EMBODIMENTS

Figure 1:
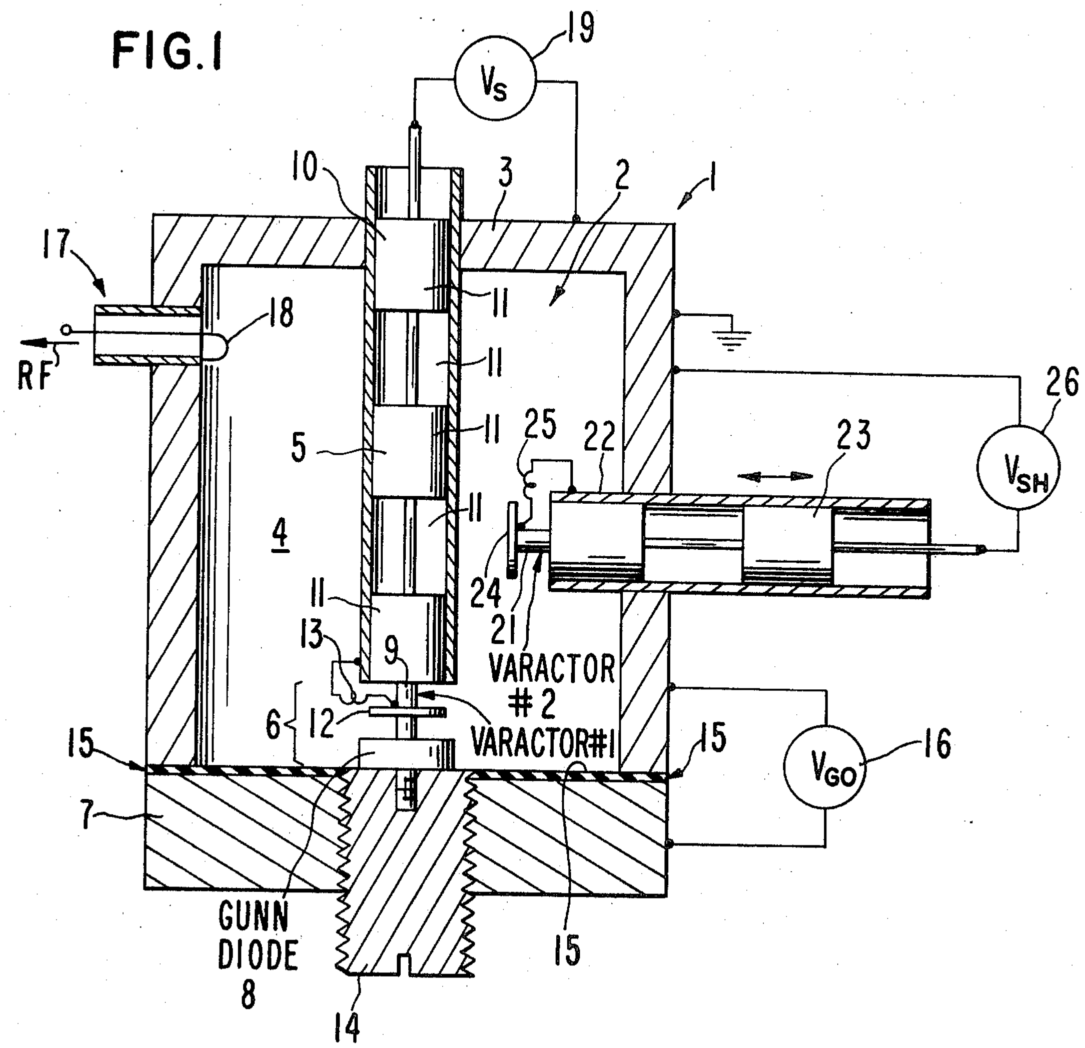
FIG. 1 is a longitudinal section view of a solid state oscillator incorporating features of the present invention.

Referring now to FIG. 1 there is shown a solid state oscillator 1 incorporating features of the present invention. The oscillator 1 includes a coaxial resonator structure 2 having an outer conductor 3 with a cylindrical internal bore or chamber 4. An inner conductor 5 is coaxially disposed of chamber 4 and projects reentrantly into the chamber 4 from one end thereof to define a capacitive gap 6 between the inner free end of the inner conductor 5 and the opposed end wall of the resonator 2.

A solid state oscillating element 8, such as a Gunn effect device, an IMPATT (Impact Avalanche and Transit Time) diode, LSA (Limited Sace Charge Accumulation) diode, bulk effect negative resistance diode etc., is positioned in the capacitive gap 6 and connected in series with the inner conductor 5. A voltage variable capacitor 9 (varactor) is connected in the capacitive gap 6 in series with the solid state oscillating element 8 at the inner end of the inner conductor 5.

The inner conductor 5 comprises a hollow tube, as of copper, having a coaxial radio frequency choke structure 10 disposed therein in DC insulative relation thereto. More specifically, the choke structure 10 includes a series of quarter wave coaxial choke sections 11 of alternating relatively low and relatively high impedance to reflect a radio frequency short circuit at the inner end of the center conductor 5. The choke structure 10 preferably includes an anodized aluminum member with the anodized surface of the choke member serving as the DC insulator between the choke 10 and the tubular inner conductor 5.

One terminal of the voltage variable capacitor 9 is conductively bonded to the inner end of the choke structure 10. A copper disc 12 is bonded to the other terminal of the voltage variable capacitor 9 and to the inner end of the solid state oscillating device 8 to form a common terminal (centertap) therebetween.

An inductive wire lead 13, as of one mil copper wire, interconnects the disc 12 and the inner conductor 5 for applying DC ground potential to the common terminal 12. The inductive wire 13 is dimensioned to have sufficient length such as to provide an inductance which will parallel resonate the package capacitance of the varactor diode 9 at a resonant frequency inside, and preferably above the center frequency of, the operating tunable range of the solid state oscillator. In this manner the stray capacitance of the varactor diode 9 is tuned out to extend the voltage tunable range of the oscillator 1. The package capacitance is a parameter supplied by the manufacturer of the diode 9 and is the capacitance of the diode package without the diode chip.

The solid state oscillating element 8 is stud mounted to the end of a thermally and electrically conductive screw 14 threadably inserted into the end wall 7. An insulative sheet 15, as of mica, is disposed between the end wall 7 and the side walls of the outer conductor 3 to provide a radio frequency bypass capacitor structure 15 to permit an independent DC potential to be applied to the end wall 7. The side wall of the outer conductor 3 is preferably a quarter wave thick such that the bypass capacitor 15 comprises a quarter wave radial choke section.

A source 16 supplies bias potential $V_{MO}$ to the solid state oscillating element 8 (Gunn diode) by applying the bias potential $V_{MO}$ to end wall 7 relative to the DC grounded outer conductor 3 and center conductor 5. A coaxial line 17 is loop coupled via conductive loop 18 to the magnetic field of the coaxial resonator 2 for extracting radio frequency energy from the oscillator 1.

A second source 19 of bias potential $V_s$ is connected between the choke structure 10 and the DC grounded outer conductor 3 for supplying a variable bias voltage $V_s$ to the series connected voltage variable capacitor 9 for tuning the resonant frequency of the resonator 2 and, thus, the output frequency of the oscillator 1.

A second voltage variable capacitor 21 is disposed within the resonator 2 in shunt with the first voltage variable capacitor 9 and the solid state oscillating element 8. The second voltage variable capacitor 21 is carried on the end of an r.f. coaxially choked conductive tube 22, in the same manner that the first variable voltage capacitor 9 is carried from the end of the hollow inner conductor 5. More particularly, a multiple section coaxial quarter wave choke structure 23 is disposed within the conductive tube 22 in DC insulative relation with respect to the tube 22. The voltage variable capacitor 21 is bonded to the inner end of the choke structure 23. A conductive disc 24, as of copper, is bonded to the inner terminal of the voltage variable capacitor 21. An inductive wire lead 25 interconnects the copper disc 24 with the outer conductive tube 22 for applying DC ground potential to the inner end of the voltage variable capacitor 21.

The multiple section coaxial choke structure 23 is preferably formed of an aluminum member anodized on its outer surface to form the insulative coating between the conductive tube 22 and the choke structure 23. A source 26 of variable bias potential $V_{sh}$ is applied between the insulated choke structure 23 and the grounded outer conductor 3 of the resonator 2 for applying a bias potential across the voltage variable capacitor 21 for changing the capacitance thereof for tuning the resonator 2.

Figure 2:
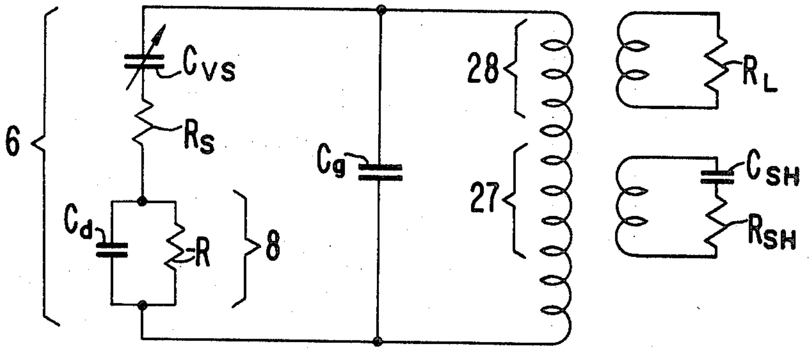
FIG. 2 is a simplified schematic equivalent circuit for the oscillator of FIG. 1.

Referring now to FIG. 2, there is shown the equivalent circuit for oscillator 1 of FIG. 1. More particularly, the resonator 2 includes series inductive portions 27 and 28 parallel connected to the capacitance $C_g$ of gap 6 to form the resonator 2. The solid state semiconductive oscillating element 8 consists of a parallel connection of the capacitance Cd of element 8 and the negative resistance −R of the element itself in series with the gap 6 and with the capacitance $C_{vs}$ of the series voltage variable capacitor 9 and its resistance Rs. The capacitance $C_{sh}$ of the second voltage variable capacitor 21 is transformer coupled in shunt with the capacitance of the gap 6 for providing additional tuning range for the solid state oscillator 1. The load resonator $R_L$ is transformer coupled to the resonator 2.

The shunt voltage variable tuning capacitor 21 may be utilized in the solid state oscillator 1 with or without the series voltage variable capacitor 9. More particularly, in certain embodiments, where less tuning range is desired, the series voltage variable capacitor 9 may be omitted and the inner conductor 5 formed of a solid conductive rod. In such a case the second voltage variable capacitor 21 would be employed for tuning the oscillator 1. In such a shunt tuned solid state oscillator 1, the tuning range is easily adjusted by varying the degree of penetration of the variable voltage capacitor 21 into the resonator 2. This adjustment is made independently of the connection of the solid state oscillating element 8. Adjusting the penetration of the voltage variable capacitor 21 also allows compensation for variations in the parameters of the voltage variable capacitance diodes, as often encountered in production.

In a typical example of a shunt tuned Ka band solid state oscillator 1, approximately 6 percent (2 GHZ) of electronic tunable bandwidth is obtained utilizing only the shunt tuning voltage variable capacitor 21. At X-band, approximately 10 percent electronic tunable bandwidth is obtained using only the shunt tuning capacitor 21.

The advantage to the hollow choked inner conductor 5 and wire 13 for applying DC ground bias potential to the series connected voltage variable capacitor 9 is that the prior art transverse DC ground bias conductor is eliminated along with its interfering resonance modes.

In a typical example of a solid state oscillator 1 utilizing both the series and shunt voltage variable capacitors 9 and 21 for tuning, 25 percent electronic tuning range is obtained at X band without encountering interfering modes of oscillation. The series tuning voltage variable capacitor 9 contributes approximately 20 percent of the electronic tuning range and the shunt tuning element 21 provides the additional 5 percent.

What is claimed is:

1. In an electronically tunable solid state oscillator, a reentrant cavity resonator means having a hollow outer conductor and a hollow inner conductor, said inner conductor having a portion projecting reentrantly into the interior of said outer conductor to define a capacitive gap between the inner end of said reentrant portion of said inner conductor and an opposed portion of said resonator, a solid state oscillating element disposed within said capacitive gap of said reentrant cavity resonator in radio frequency energy exchanging relation with the radio frequency electric field of said capacitive gap for exciting said cavity resonator with radio frequency energy at the resonant frequency of said cavity resonator, solid state voltage variable capacitance means connected in series for radio frequency energy with said solid state oscillating element and disposed within said capacitive gap of said resonator, radio frequency choke means disposed within said hollow inner conductor in DC insulative relation with said inner conductor for applying a first bias potential to one end terminal of said series connection of said voltage variable capacitance means and said solid state oscillating element, means for applying a second bias potential to the other end terminal of said series connection of said voltage variable capacitance means and said oscillating element, inductive wire means for applying a ground bias potential to the common terminal intermediate said series connected voltage variable capacitance means and said solid state oscillator element, and said inductive wire means being dimensioned to parallel resonate with the package capacitance of said voltage variable capacitance means at a frequency to substantially tune out said package capacitance within the tunable frequency band of the tunable solid state oscillator.

2. The apparatus of claim 1 including means for varying the bias potential applied across said voltage variable capacitance means for electronically varying the resonant frequency of said reentrant cavity resonator and thus the frequency of radio frequency excitation of said resonator.

3. The apparatus of claim 1 wherein said solid state oscillating element is a bulk effect negative resistance diode.

4. The apparatus of claim 1 wherein said variable capacitance means is a voltage variable capacitance diode.

5. The apparatus of claim 1 wherein said inductive wire means connects said common terminal and said inner conductor, and means for establishing a DC ground bias potential on said inner conductor.

6. The apparatus of claim 1 wherein said inductive wire is connected at one end to said common terminal and at the other end to the inner end of said reentrant inner conductor.

7. In an electronically tunable solid state oscillator, a reentrant cavity resonator means having a hollow outer conductor and a hollow inner conductor, said inner conductor having a portion projecting reentrantly into the interior of said outer conductor to define a capacitive gap between the inner end of said reentrant portion of said inner conductor and an opposed portion of said resonator, a solid state oscillating element disposed within said capacitive gap of said reentrant cavity resonator in radio frequency energy exchanging relation with the radio frequency electric field of said capacitive gap for exciting said cavity resonator with radio frequency energy at the resonant frequency of said cavity resonator, solid state voltage variable capacitance means connected in series for radio frequency energy with said solid state oscillating element and disposed within said capacitive gap of said resonator, radio frequency choke means disposed within said hollow inner conductor in DC insulative relation with said inner conductor for applying a first bias potential to one end terminal of said series connection of said voltage variable capacitance means and said solid state oscillating element, means for applying a second bias potential to the other end terminal of said series connection of said voltage variable capacitance means and said oscillating element, inductive wire means for applying a ground bias potential to the common terminal intermediate said series connected voltage variable capacitance means and said solid state oscillator element. Second solid state electrically variable capacitance means disposed within said reentrant cavity resonator and outside of said capacitive gap in shunt with said solid state oscillating element, and means for applying a bias potential across said second variable capacitance means.

8. The apparatus of claim 7 wherein said means for applying a bias potential across said second variable capacitance means includes; second hollow conductor means having a bore intersecting with the hollow interior of said outer conductor of said cavity resonator, second radio frequency choke means disposed within said bore in DC insulative relation with respect to said second hollow conductor, said second variable capacitance means having first and second terminals, said first terminal of said second capacitance means being connected electrically to said second choke means, and second inductive wire means connecting said second hollow conductor and said second terminal of said second variable capacitance means.

* * * * *